(12) United States Patent
Huang et al.

(10) Patent No.: US 12,250,810 B2
(45) Date of Patent: Mar. 11, 2025

(54) SMALL-AREA HIGH-EFFICIENCY READ-ONLY MEMORY (ROM) ARRAY AND METHOD FOR OPERATING THE SAME

(71) Applicant: YIELD MICROELECTRONICS CORP., Chu-Pei (TW)

(72) Inventors: Yu Ting Huang, Chu-Pei (TW); Chi Pei Wu, Chu-Pei (TW)

(73) Assignee: Yield Microelectronics Corp., Chu-pei (TW)

( * ) Notice: Subject to any disclaimer, the term of this patent is extended or adjusted under 35 U.S.C. 154(b) by 120 days.

(21) Appl. No.: 18/186,278

(22) Filed: Mar. 20, 2023

(65) Prior Publication Data
US 2024/0260260 A1    Aug. 1, 2024

(30) Foreign Application Priority Data
Feb. 1, 2023 (TW) .................................. 112103524

(51) Int. Cl.
*H10B 41/00* (2023.01)
*G11C 17/12* (2006.01)
*H10B 20/00* (2023.01)

(52) U.S. Cl.
CPC ......... *H10B 20/363* (2023.02); *G11C 17/126* (2013.01)

(58) Field of Classification Search
CPC ..... G11C 16/0416; G11C 16/10; G11C 16/14; G11C 16/16; G11C 17/04; G11C 17/08; G11C 17/126; G11C 2216/16; G11C 17/12; H01L 28/40; H01L 29/42324; H01L 29/788; H10B 20/30; H10B 20/363; H10B 41/30; H10B 41/60; H10B 20/20; H10B 20/34; H10B 69/00
See application file for complete search history.

(56) References Cited

U.S. PATENT DOCUMENTS 9,318,208 B1 *  4/2016  Lin ....................... G11C 16/14

\* cited by examiner

*Primary Examiner* — Thong Q Le
(74) *Attorney, Agent, or Firm* — Rosenberg, Klein & Lee

(57) ABSTRACT

A small-area high-efficiency read-only memory (ROM) array and a method for operating the same are provided. The small-area high-efficiency ROM array includes bit lines, word common-source lines, and sub-memory arrays. Each sub-memory array includes first, second, third, and fourth memory cells connected to a bit line and a word common-source line. All the memory cells are connected to the same word common-source line and respectively connected to different bit lines. Sharing the gate and the source can not only greatly reduce the overall layout area, but also effectively reduce the load of the memory array to achieve the high-efficiency reading and writing goal.

8 Claims, 5 Drawing Sheets

SMALL-AREA HIGH-EFFICIENCY READ-ONLY MEMORY (ROM) ARRAY AND METHOD FOR OPERATING THE SAME

This application claims priority for the TW patent application no. 112103524 filed on 1 Feb. 2023, the content of which is incorporated by reference in its entirely.

BACKGROUND OF THE INVENTION

Field of the Invention

The present invention relates to a memory array, and in particular to a small-area high-efficiency read-only memory (ROM) array and a method for operating the same.

Description of the Related Art

Presently, in the semiconductor industry, Complementary Metal Oxide Semiconductor (CMOS) manufacturing process has become an ordinary manufacturing method for Application Specific Integrated Circuit (ASIC). With the rapid progress and development of the computer and information industries, Flash memory and electrically-erasable-programmable read-only memory (EEPROM) have been widely utilized in various electronic products for its non-volatile memory capability of being electrically programmable and erasable, such that data stored therein will not be lost, even when its power supply is turned off.

In general, a non-volatile memory is programmable, and the memory stores charges in order to change the gate voltage of a transistor in the memory, or the memory will not store charges, such that the gate voltage remains unchanged as the original gate voltage of the transistor in the memory. For an erasure operation, the charges stored in the non-volatile memory are removed, such that the gate voltage of the transistor in the memory will return to its original value. Although the current flash memory architecture has a small area and a low cost, it only supports the erasing and writing activities of large blocks. The current flash memory architecture cannot only erase and write specific one-bit memory cells, which is more inconvenient in use. In addition, an electronically erasable programmable read-only memory having byte writing functions is more convenient to use than the flash memory. However, in the conventional read-only memory array structure, there are many types of control voltages and memory elements, and the gate and source are usually independent of each other. In such a case, multiple voltage sources are required for operation, and relatively large area and memory array load are required.

To overcome the abovementioned problems, the present invention provides a small-area high-efficiency read-only memory (ROM) array and a method for operating the same, so as to solve the afore-mentioned problems of the prior art.

SUMMARY OF THE INVENTION

In view of the problems and shortcomings of the prior art, the major objective of the present invention is to provide a small-area high-efficiency read-only memory (ROM) array and a method for operating the same, which share the source and the gate to complete the reading and writing activities of the ROM array with the smallest area, thereby reducing the load of the memory array and improving the operating efficiency. In addition, the present invention can further reduce the variety of control voltages to prevent from the leakage current.

In order to achieve the foregoing objective, the present invention provides a small-area high-efficiency read-only memory (ROM) array, which includes a plurality of parallel bit lines, a plurality of parallel word common-source lines, and a plurality of sub-memory arrays. The parallel bit lines include a first bit line, a second bit line, a third bit line, and a fourth bit line adjacent to each other. The parallel word common-source lines, arranged perpendicular to the bit lines, include a first word common-source line. Each sub-memory array is connected to four of the bit lines and one of the word common-source lines. Each sub-memory array includes a first memory cell, a second memory cell, a third memory cell, and a fourth memory cell. The first memory cell is connected to the first bit line and the first word common-source line. The second memory cell is connected to the second bit line and the first word common-source line. The first memory cell and the second memory cell are arranged adjacent to each other in a vertical direction. The third memory cell is connected to the third bit line and the first word common-source line. The third memory cell and the first memory cell are arranged adjacent to each other in a horizontal direction. The fourth memory cell is connected to the fourth bit line and the first word common-source line and arranged at a point where the vertical direction corresponding to the third memory cell intersects the horizontal direction corresponding to the second memory cell. The first memory cell, the second memory cell, the third memory cell, and the fourth memory cell are arranged between the first bit line and the fourth bit line.

Each of the first memory cell, the second memory cell, the third memory cell, and the fourth memory cell includes a field-effect transistor (FET) with a drain, a source, and a gate. The FETs of the first memory cell, the second memory cell, the third memory cell, and the fourth memory cell share a dielectric layer. The dielectric layer partially overlaps the sources and the gates of the FETs to connect to the sources and the gates of the FETs.

The first memory cell, second memory cell, third memory cell, and fourth memory cell are operation memory cells, one of the operation memory cells is chosen as a selected memory cell and remains of the operation memory cells are chosen as a plurality of unselected memory cells.

Each of the first memory cell, second memory cell, third memory cell, and fourth memory cell includes an N-type field-effect transistor in a P-type substrate or in a P-type well region or includes a P-type field-effect transistor in an N-type substrate or in an N-type well region.

When each of the first memory cell, second memory cell, third memory cell, and fourth memory cell has an N-type FET, performing following voltage applications as required: providing a work power voltage $V_{dd}$, applying a substrate voltage $V_{sub}$ to the P-type well region or the P-type substrate connecting to the selected memory cell, respectively applying a bit voltage $V_{b1}$ and a word common-source voltage $V_{ws1}$ to the bit line and the word common-source line, which are connected to the selected memory cell, and respectively applying a bit voltage $V_{b2}$ and a word common-source voltage $V_{ws2}$ to the bit line and the word common-source line, which are connected to each of the plurality of unselected memory cells.

In a write activity, the voltages satisfy following conditions: $V_{sub}$ is grounded, $V_{b1}$ is equal to a medium voltage (MV) or 0 volt, $V_{ws1}$ is equal to a high voltage (HV) or the MV, $V_{b2}$ is electrically floating, and $V_{ws2}$=0 volt. In an erase activity, the voltages satisfy following conditions: $V_{sub}$ is grounded, $V_{b1}$ is equal to the HV, $V_{ws1}$=0 volt, $V_{b2}$ is electrically floating, and $V_{ws2}$ is equal to the MV. In a read activity, the voltages satisfy following conditions: $V_{sub}$ is grounded, $V_{ws1}>V_{b1}=0$ volt, $V_{b2}=V_{ws1}$, and $V_{ws2}$ is grounded.

When each of the first memory cell, second memory cell, third memory cell, and fourth memory cell has a P-type FET, performing following voltage applications as required: providing a work power voltage $V_{dd}$, applying a substrate voltage $V_{sub}$ to the N-type well region or the N-type substrate connecting to the selected memory cell, respectively applying a bit voltage $V_{b1}$ and a word common-source voltage $V_{ws1}$ to the bit line and the word common-source line, which are connected to the selected memory cell, and respectively applying a bit voltage $V_{b2}$ and a word common-source voltage $V_{ws2}$ to the bit line and the word common-source line, which are connected to each of the plurality of unselected memory cells.

In a write activity, the voltages satisfy following conditions: $V_{sub}$ is equal to a high voltage (HV), $V_{b1}$ is equal to a medium voltage (MV) or the HV, $V_{ws1}$ is equal to 0 volt or the MV, $V_{b2}$ is electrically floating, and $V_{ws2}$ is equal to the HV. In an erase activity, the voltages satisfy following conditions: $V_{sub}$ is equal to the HV, $V_{b1}=0$ volt, $V_{ws1}$ is equal to the HV, $V_{b2}$ is electrically floating, and $V_{ws2}$ is equal to the MV. In a read activity, the voltages satisfy following conditions: $V_{sub}=V_{dd}$, $V_{b1}>V_{ws1}=0$ volt, and $V_{ws2}=V_{dd}$.

Below, the embodiments are described in detail in cooperation with the drawings to make easily understood the technical contents, characteristics and accomplishments of the present invention.

DETAILED DESCRIPTION OF THE INVENTION

Figure 1:
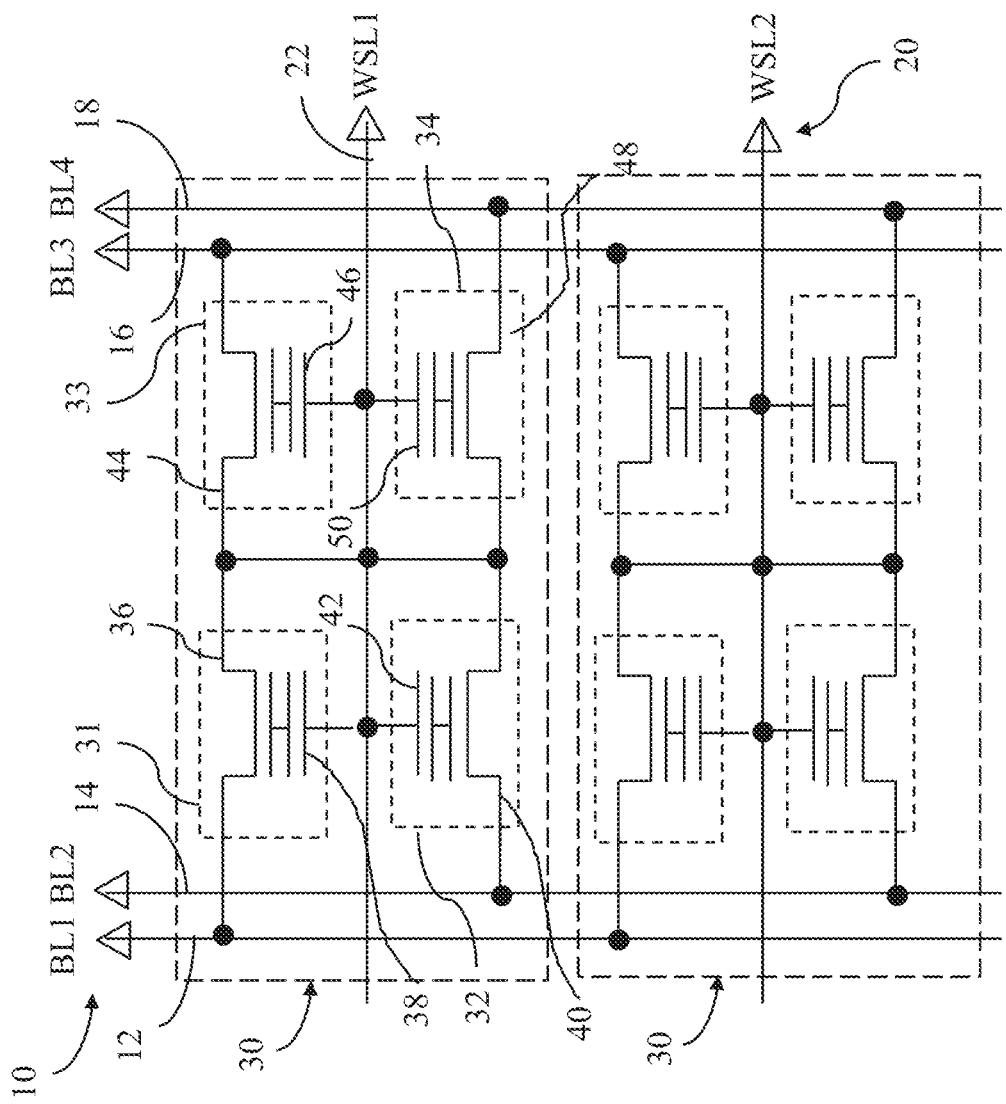
FIG. 1 is a diagram schematically illustrating the circuit of a small-area high-efficiency read-only memory (ROM) array according to an embodiment of the present invention.
Figure 2:
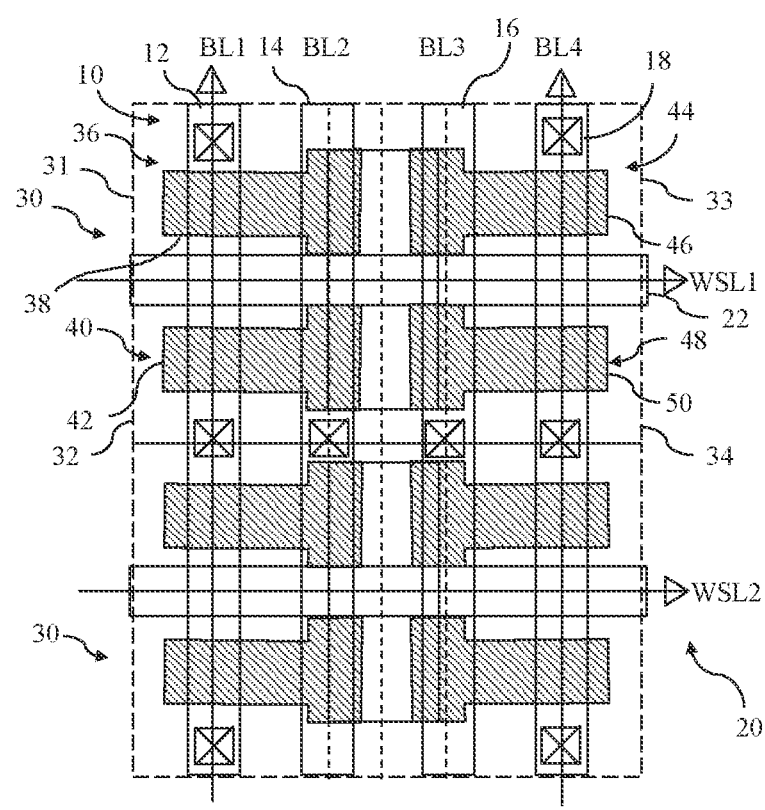
FIG. 2 is a diagram schematically illustrating the circuit layout of a small-area high-efficiency read-only memory (ROM) array according to an embodiment of the present invention.

Please refer to FIG. 1 and FIG. 2. In an embodiment of the present invention, a small-area high-efficiency read-only memory (ROM) array includes a plurality of parallel bit lines 10, a plurality of parallel word common-source lines 20, and a plurality of sub-memory arrays 30. The bit lines 10 include bit lines BL1~BL4. The bit line BL1 is defined as a first bit line 12, the bit line BL2 is defined as a second bit line 14, the bit line BL3 is defined as a third bit line 16, and the bit line BL4 is defined as a fourth bit line 18. The word common-source lines 20 are perpendicular to the bit lines 10. The word common-source lines 20 include word lines WSL1~WSL2. The word line WSL1 is defined as a first word common-source line 22. The bit lines 10 and the word common-source lines 20 are connected to the sub-memory arrays 30. As illustrated in FIG. 1 and FIG. 2, the two sub-memory arrays 30 are arranged from top to bottom.

Each sub-memory array 30 is connected to four bit lines 10 and one word common-source line 20. Since the connections of each sub-memory array 30 to the bit lines 10 and the word common-source line 20 are similar, they are described in detail as follows.

Figure 3:
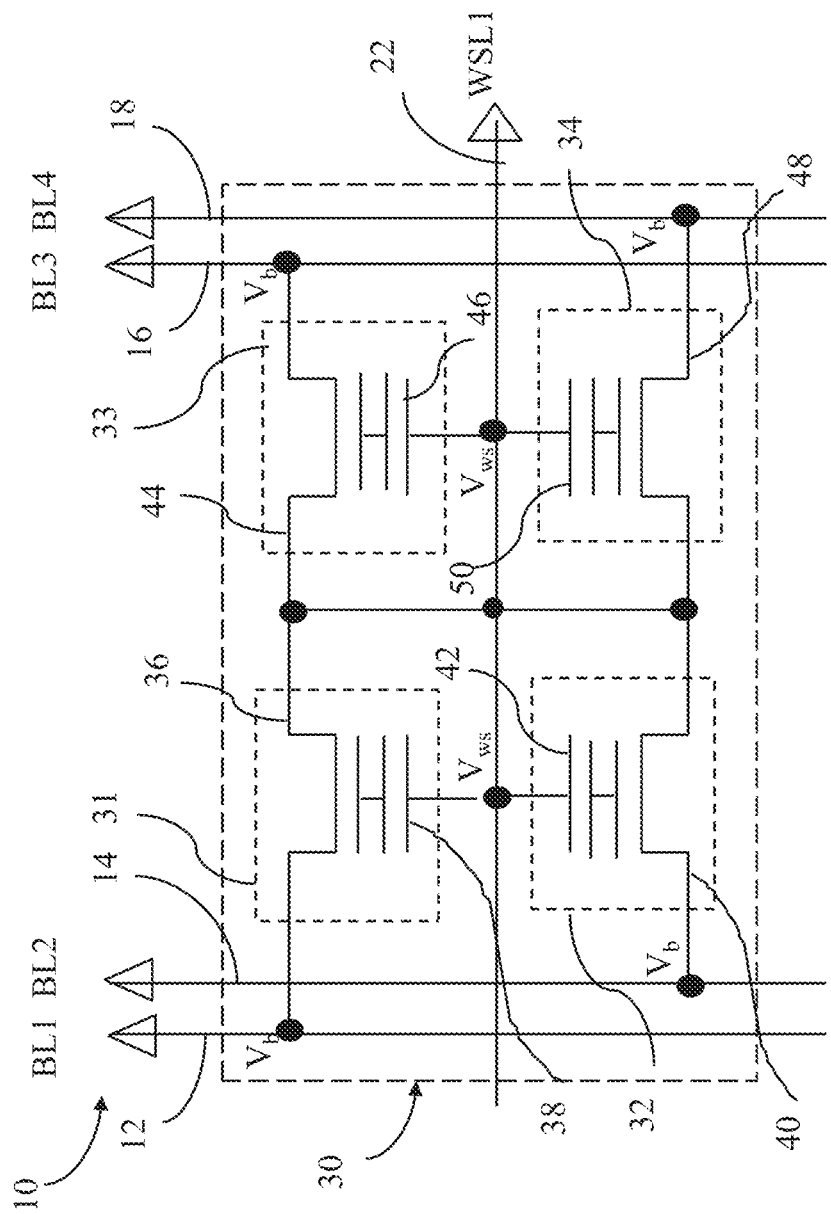
FIG. 3 is a diagram schematically illustrating the circuit of a sub-memory array according to an embodiment the present invention.

Please refer to FIG. 2 and FIG. 3. Each sub-memory array 30, including a first memory cell 31, a second memory cell 32, a third memory cell 33, and a fourth memory cell 34, is arranged between the first bit line 12 and the fourth bit line 18. The first memory cell 31 is connected to the first bit line 12 and the first word common-source line 22. The second memory cell 32 is connected to the second bit line 14 and the first word common-source line 22. The first memory cell 31 and the second memory cell 32 are arranged adjacent to each other in a vertical direction. The third memory cell 33 is connected to the third bit line 16 and the first word common-source line 22. The third memory cell 33 and the first memory cell 31 are arranged adjacent to each other in a horizontal direction. The fourth memory cell 34 is connected to the fourth bit line 18 and the first word common-source line 22 and arranged at a point where the vertical direction corresponding to the third memory cell 33 intersects the horizontal direction corresponding to the second memory cell 32.

Furthermore, the first memory cell 31 includes a field-effect transistor (FET) 36 and a capacitor 38. The FET 36 has a gate. The drain of the FET 36 is connected to the first bit line 12. The source and the gate of the FET 36 are connected to the first word common-source line 22. The bias $V_{ws}$ of the first word common-source line 22 is coupled to the FET 36 through the capacitor 38. The capacitor 38 and the gate of the FET 36 include the same polysilicon. The FET 36 receives the biases $V_b$ and $V_{ws}$ of the first bit line 12 and the first word common-source line 22 to write data into the gate of the FET 36 or erase data from the gate of the FET 36.

The second memory cell 32 includes a field-effect transistor (FET) 40 and a capacitor 42. The FET 40 has a gate. The drain of the FET 40 is connected to the second bit line 14. The source and the gate of the FET 40 are connected to the first word common-source line 22. The bias $V_{ws}$ of the first word common-source line 22 is coupled to the FET 40 through the capacitor 42. The capacitor 42 is directly connected to the capacitor 38 and arranged between the FETs 36 and 40. The FET 40 receives the biases $V_b$ and $V_{ws}$ of the second bit line 14 and the first word common-source line 22 to write data into the gate of the FET 40 or erase data from the gate of the FET 40.

The third memory cell 33 includes a field-effect transistor (FET) 44 and a capacitor 46. The FET 44 has a gate. The drain of the FET 44 is connected to the third bit line 16. The source and the gate of the FET 44 are connected to the first word common-source line 22. The bias $V_{ws}$ of the first word common-source line 22 is coupled to the FET 44 through the capacitor 46. The capacitor 46 and the gate of the FET 44 include the same polysilicon. The capacitor 46 and the FET 44 are symmetrical to the capacitor 38 and the FET 36 with the first word common-source line 22 being an axis. The FET 44 receives the biases $V_b$ and $V_{ws}$ of the third bit line 16 and the first word common-source line 22 to write data into the gate of the FET 44 or erase data from the gate of the FET 44.

The fourth memory cell 34 includes a field-effect transistor (FET) 48 and a capacitor 50. The FET 48 has a gate. The drain of the FET 48 is connected to the fourth bit line 18. The source and the gate of the FET 48 are connected to the first word common-source line 22, thereby connecting to the gates and the sources of the FETs 36, 40, and 44. The bias $V_{ws}$ of the first word common-source line 22 is coupled to the FET 48 through the capacitor 50. The capacitor 50 and the gate of the FET 48 include the same polysilicon. The capacitor 50 and the FET 48 are symmetrical to the capacitor 42 and the FET 40 with the first word common-source line 22 being an axis. The capacitor 50 is directly connected to the capacitor 46 and arranged between the FETs 48 and 44. The FET 48 receives the biases $V_b$ and $V_{ws}$ of the fourth bit line 18 and the first word common-source line 22 to write data into the gate of the FET 48 or erase data from the gate of the FET 48.

The first, second, third, and fourth memory cells 31, 32, 33, and 34 are connected to the first word common-source line 22, which is connected to the sources and the gates of the FETs 36, 40, 44, and 48 of the first, second, third, and fourth memory cells 31, 32, 33, and 34. Compared with the independent configuration of the source and the gate, the area of overall layout can be reduced, hereby reducing the production cost significantly.

The FETs 36, 40, 44, and 48 mentioned above can be N-type field effect transistors each located in a P-type well region or in a P-type substrate. Alternatively, they may each be a P-type field effect transistor located in an N-type well region or in an N-type substrate. In the present invention, the operations for N-type field effect transistor and P-type field effect transistor are different. In the following, the operations of the FETs 36, 40, 44, and 48 as N-type field effect transistors are first described. In order to understand the ways of operations, the names of various memory cells are first clearly defined as follows.

In the description mentioned above, the first, second, third, and fourth memory cells 31, 32, 33, and 34 can all be considered as operation memory cells, and one of the operation memory cells can be chosen as the selected memory cell to proceed with the operations as required. The remains of the operation memory cells are referred to as a plurality of unselected memory cells.

When operating on the selected memory cells, performing the following voltage applications as required: providing a work power voltage $V_{dd}$, applying a substrate voltage $V_{sub}$ to the P-type well region or the P-type substrate connecting to the selected memory cell, respectively applying a bit voltage $V_{b1}$ and a word common-source voltage $V_{ws1}$ to the bit line and the word common-source line, which are connected to the selected memory cell, and respectively applying a bit voltage $V_{b2}$ and a word common-source voltage $V_{ws2}$ to the bit line and the word common-source line, which are connected to each of the plurality of unselected memory cells. In a write activity, the voltages satisfy following conditions: $V_{sub}$ is grounded, $V_{b1}$ is equal to a medium voltage (MV) or 0 volt, $V_{ws1}$ is equal to a high voltage (HV) or the MV, $V_{b2}$ is electrically floating, and $V_{ws2}$=0 volt. In an erase activity, the voltages satisfy following conditions: $V_{sub}$ is grounded, $V_{b1}$ is equal to the HV, $V_{ws1}$=0 volt, $V_{b2}$ is electrically floating, and $V_{ws2}$ is equal to the MV. In a read activity, the voltages satisfy following conditions: $V_{sub}$ is grounded, $V_{ws1}>V_{b1}$=0 volt, $V_{b2}=V_{ws1}$, and $V_{ws2}$ is grounded.

In case that the FETs 36, 40, 44, and 48 are P-type field effect transistors, then according to the definitions of the memory cells and voltages mentioned above, when in operations, performing the following voltage applications as required: providing a work power voltage $V_{dd}$, applying a substrate voltage $V_{sub}$ to the N-type well region or the N-type substrate connecting to the selected memory cell, respectively applying a bit voltage $V_{b1}$ and a word common-source voltage $V_{ws1}$ to the bit line and the word common-source line, which are connected to the selected memory cell, and respectively applying a bit voltage $V_{b2}$ and a word common-source voltage $V_{ws2}$ to the bit line and the word common-source line, which are connected to each of the plurality of unselected memory cells. In a write activity, the voltages satisfy following conditions: $V_{sub}$ is equal to a high voltage (HV), $V_{b1}$ is equal to a medium voltage (MV) or the HV, $V_{ws1}$ is equal to 0 volt or the MV, $V_{b2}$ is electrically floating, and $V_{ws2}$ is equal to the HV. In an erase activity, the voltages satisfy following conditions: $V_{sub}$ is equal to the HV, $V_{b1}$=0 volt, $V_{ws1}$ is equal to the HV, $V_{b2}$ is electrically floating, and $V_{ws2}$ is equal to the MV. In a read activity, the voltages satisfy following conditions: $V_{sub}=V_{dd}$, $V_{b1}>V_{ws1}$=0 volt, and $V_{ws2}=V_{dd}$.

Further explain the definitions of "high voltage (HV)" and "medium voltage (MV)" in the foregoing operating conditions. As the name implies, "high voltage">"medium voltage", and "high voltage" is usually slightly lower than the breakdown voltage of the drain to source. Specifically, "high voltage"=the breakdown voltage of the drain to the source minus the threshold voltage Vt of the transistor, and "medium voltage"=the breakdown voltage of the drain to the source×½.

Figure 4:
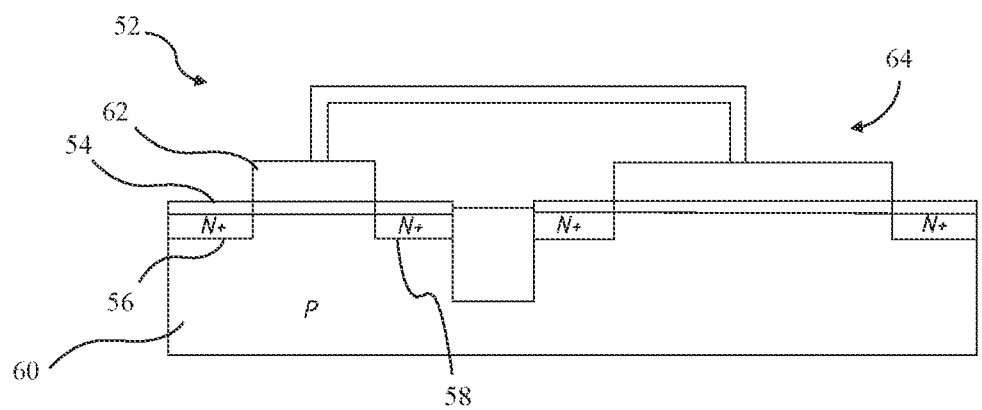
FIG. 4 is a cross-sectional view of an N-type field effect transistor and a capacitor according to the present invention.

The cross-sectional view of the structures of the FETs 36, 40, 44, and 48 and the capacitors 38, 42, 44, and 50 are introduced as follows. In this case, an N-type field effect transistor is taken as an example for explanation. As illustrated in FIG. 4, an N-type field effect transistor 52 includes a dielectric layer 54 formed on the surface of a P-type semiconductor substrate 60 as the semiconductor substrate. A gate 62 is stacked on the dielectric layer 54. Two ion-doped areas are formed in the P-type semiconductor substrate 60 and respectively used as a source 56 and a drain 58. A capacitor 64 and the N-type field effect transistor 52 are horizontally formed in the P-type semiconductor substrate 60. The capacitor 64 and the gate 62 include the same polysilicon. When the semiconductor substrate is an N type, a P-type well may be formed in the substrate and the N-type field effect transistor 52 formed in the P-type well.

Figure 5:
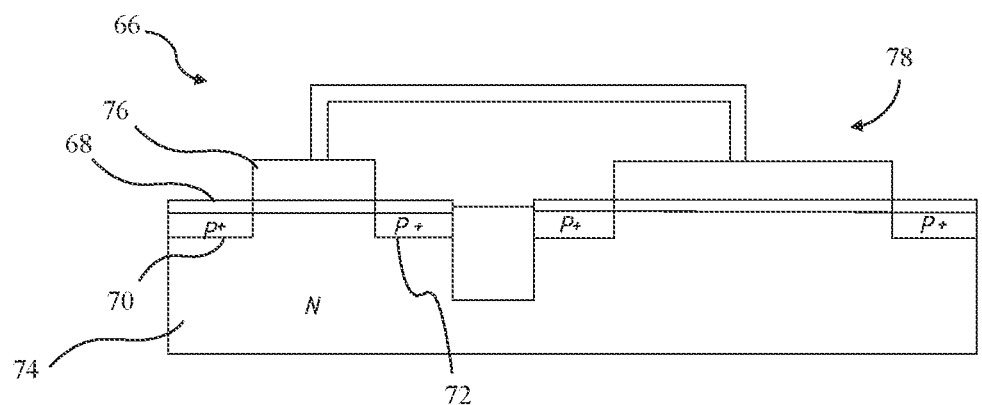
FIG. 5 is a cross-sectional view of a P-type field effect transistor and a capacitor according to the present invention.

Similarly, the cross-sectional view of the structures of the FETs 36, 40, 44, and 48 and the capacitors 38, 42, 44, and 50 are introduced as follows. In this case, a P-type field effect transistor is taken as an example for explanation. As illustrated in FIG. 5, a P-type field effect transistor 66 includes a dielectric layer 68 formed on the surface of an N-type semiconductor substrate 74 as the semiconductor substrate. A gate 76 is stacked on the dielectric layer 68. Two ion-doped areas are formed in the N-type semiconductor substrate 74 and respectively used as a source 70 and a drain 72. A capacitor 78 and the P-type field effect transistor 66 are horizontally formed in the N-type semiconductor substrate 74. The capacitor 78 and the gate 76 include the same polysilicon. When the semiconductor substrate is a P type, an N-type well may be formed in the substrate and the P-type field effect transistor 66 formed in the N-type well.

The FETs 36, 40, 44, and 48 of the first, second, third, and fourth memory cells 31, 32, 33, and 34 share the same dielectric layer. The dielectric layer partially overlaps the sources and the gates of the FETs 36, 40, 44, and 48, thereby connecting to the sources and the gates of the FETs 36, 40, 44, and 48 of the first, second, third, and fourth memory cells 31, 32, 33, and 34. As a result, the FETs 36, 40, 44, and 48 of the first, second, third, and fourth memory cells 31, 32, 33, and 34 share the gate and the source to connect to the same word common-source line 22, such that the memory cells to be operated are respectively selected by the first, second, third, and fourth bit lines 12, 14, 16 and 18.

In conclusion, the small-area high-efficiency read-only memory (ROM) array and the method for operating the same of the present invention connect the memory cells to the same word common-source line and different bit lines. The present invention shares the gate and the source to complete the reading and writing of read-only memory with the smallest overall layout area. In addition, it can employ the least control voltage to reduce the memory array load, the current consumption, and the manufacturing cost and improve the operating efficiency.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A small-area high-efficiency read-only memory (ROM) array, comprising:
   a plurality of parallel bit lines comprising a first bit line, a second bit line, a third bit line, and a fourth bit line adjacent to each other;
   a plurality of parallel word common-source lines, arranged perpendicular to the bit lines, comprising a first word common-source line; and
   a plurality of sub-memory arrays, wherein each of the plurality of sub-memory arrays is connected to four of the bit lines and one of the word common-source lines, and each of the plurality of sub-memory arrays comprises:
   a first memory cell connected to the first bit line and the first word common-source line;
   a second memory cell connected to the second bit line and the first word common-source line, wherein the first memory cell and the second memory cell are arranged adjacent to each other in a vertical direction;
   a third memory cell connected to the third bit line and the first word common-source line, wherein the third memory cell and the first memory cell are arranged adjacent to each other in a horizontal direction; and
   a fourth memory cell connected to the fourth bit line and the first word common-source line and arranged at a point where the vertical direction corresponding to the third memory cell intersects the horizontal direction corresponding to the second memory cell,
   wherein the first memory cell, the second memory cell, the third memory cell, and the fourth memory cell are arranged between the first bit line and the fourth bit line,
   wherein each of the first memory cell, the second memory cell, the third memory cell, and the fourth memory cell comprises a field-effect transistor (FET) with a drain, a source, and a gate,
   wherein the FETs of the first memory cell, the second memory cell, the third memory cell, and the fourth memory cell share a dielectric layer,
   wherein the dielectric layer partially overlaps the sources and the gates of the FETs, and
   wherein the source and the gate of each FET of the sub-memory array are each connected to the first word common-source line.

2. The small-area high-efficiency ROM array according to claim 1, wherein the FET is a P-channel field-effect transistor or an N-channel field-effect transistor.

3. The small-area high-efficiency ROM array according to claim 1, wherein the first memory cell comprises a field-effect transistor (FET) with a drain, a source, and a gate, the drain is connected to the first bit line, the source and the gate are connected to the first word common-source line, a bias of the first word common-source line is coupled to the FET through a capacitor, the capacitor and the gate of the FET comprise same polysilicon, and the FET is configured to receive biases of the first bit line and the first word common-source line to write data into the gate or erase data from the gate.

4. The small-area high-efficiency ROM array according to claim 1, wherein the second memory cell comprises a field-effect transistor (FET) with a drain, a source, and a gate, the drain is connected to the second bit line, the source and the gate are connected to the first word common-source line, a bias of the first word common-source line is coupled to the FET through a capacitor, the capacitor and the gate of the FET comprise same polysilicon, and the FET is configured to receive biases of the second bit line and the first word common-source line to write data into the gate or erase data from the gate.

5. The small-area high-efficiency ROM array according to claim 1, wherein the third memory cell comprises a field-effect transistor (FET) with a drain, a source, and a gate, the drain is connected to the third bit line, the source and the gate are connected to the first word common-source line, a bias of the first word common-source line is coupled to the FET through a capacitor, the capacitor and the gate of the FET comprise same polysilicon, and the FET is configured to receive biases of the third bit line and the first word common-source line to write data into the gate or erase data from the gate.

6. The small-area high-efficiency ROM array according to claim 1, wherein the fourth memory cell comprises a field-effect transistor (FET) with a drain, a source, and a gate, the drain is connected to the fourth bit line, the source and the gate are connected to the first word common-source line, a bias of the first word common-source line is coupled to the FET through a capacitor, the capacitor and the gate of the FET comprise same polysilicon, and the FET is configured to receive biases of the fourth bit line and the first word common-source line to write data into the gate or erase data from the gate.

7. A method for operating a small-area high-efficiency read-only memory (ROM) array, the small-area high-efficiency ROM array comprising a plurality of parallel bit lines, a plurality of parallel word common-source lines, and a plurality of sub-memory arrays, the plurality of parallel bit lines comprising a first bit line, a second bit line, a third bit line, and a fourth bit line adjacent to each other, the plurality of parallel word common-source lines, arranged perpendicular to the bit lines, comprising a first word common-source line, each of the plurality of sub-memory arrays connected to four of the bit lines and one of the word common-source lines, each of the plurality of sub-memory arrays comprises a first memory cell, a second memory cell, a third memory cell, and a fourth memory cell, the first memory cell connected to the first bit line and the first word common-source line, the second memory cell connected to the second bit line and the first word common-source line, the first memory cell and the second memory cell arranged adjacent to each other in a vertical direction, the third memory cell connected to the third bit line and the first word common-source line, the third memory cell and the first memory cell arranged adjacent to each other in a horizontal direction, the fourth memory cell connected to the fourth bit line and the first word common-source line and arranged at a point where the vertical direction corresponding to the third memory cell intersects the horizontal direction corresponding to the second memory cell, and the first memory cell, the second memory cell, the third memory cell, the fourth memory cell arranged between the first bit line and the fourth bit line, each of the first memory cell, second memory cell, third memory cell, and fourth memory cell comprises an N-type field-effect transistor in a P-type substrate or in a P-type well region, the first memory cell, second memory cell, third memory cell, and fourth memory cell are operation memory cells, one of the operation memory cells is chosen as a selected memory cell and remains of the operation memory cells are chosen as a plurality of unselected memory cells, wherein when operating on the selected memory cell, performing following voltage applications as required:

providing a work power voltage $V_{dd}$;

applying a substrate voltage $V_{sub}$ to the P-type well region or the P-type substrate connecting to the selected memory cell, respectively applying a bit voltage $V_{b1}$ and a word common-source voltage $V_{ws1}$ to the bit line and the word common-source line, which are connected to the selected memory cell, and respectively applying a bit voltage $V_{b2}$ and a word common-source voltage $V_{ws2}$ to the bit line and the word common-source line, which are connected to each of the plurality of unselected memory cells;

wherein in a write activity, the voltages satisfy following conditions:

$V_{sub}$ is grounded, $V_{b1}$ is equal to a medium voltage (MV) or 0 volt, $V_{ws1}$ is equal to a high voltage (HV) or the MV, $V_{b2}$ is electrically floating, and $V_{ws2}=0$ volt;

wherein in an erase activity, the voltages satisfy following conditions:

$V_{sub}$ is grounded, $V_{b1}$ is equal to the HV, $V_{ws1}=0$ volt, $V_{b2}$ is electrically floating, and $V_{ws2}$ is equal to the MV;

wherein in a read activity, the voltages satisfy following conditions:

$V_{sub}$ is grounded, $V_{ws1}>V_{b1}=0$ volt, $V_{b2}=V_{ws1}$, and $V_{ws2}$ is grounded;

wherein each of the first memory cell, the second memory cell, the third memory cell, and the fourth memory cell comprises a field-effect transistor (FET) with a drain, a source, and a gate;

wherein the FETs of the first memory cell, the second memory cell, the third memory cell, and the fourth memory cell share a dielectric layer;

wherein the dielectric layer partially overlaps the sources and the gates of the FETs; and wherein the source and the gate of each FET of the sub-memory array are each connected to the first word common-source line.

8. A method for operating a small-area high-efficiency read-only memory (ROM) array, the small-area high-efficiency ROM array comprising a plurality of parallel bit lines, a plurality of parallel word common-source lines, and a plurality of sub-memory arrays, the plurality of parallel bit lines comprising a first bit line, a second bit line, a third bit line, and a fourth bit line adjacent to each other, the plurality of parallel word common-source lines, arranged perpendicular to the bit lines, comprising a first word common-source line, each of the plurality of sub-memory arrays connected to four of the bit lines and one of the word common-source lines, each of the plurality of sub-memory arrays comprises a first memory cell, a second memory cell, a third memory cell, and a fourth memory cell, the first memory cell connected to the first bit line and the first word common-source line, the second memory cell connected to the second bit line and the first word common-source line, the first memory cell and the second memory cell arranged adjacent to each other in a vertical direction, the third memory cell connected to the third bit line and the first word common-source line, the third memory cell and the first memory cell arranged adjacent to each other in a horizontal direction, the fourth memory cell connected to the fourth bit line and the first word common-source line and arranged at a point where the vertical direction corresponding to the third memory cell intersects the horizontal direction corresponding to the second memory cell, and the first memory cell, the second memory cell, the third memory cell, the fourth memory cell arranged between the first bit line and the fourth bit line, each of the first memory cell, second memory cell, third memory cell, and fourth memory cell comprises a P-type field-effect transistor in an N-type substrate or in an N-type well region, the first memory cell, second memory cell, third memory cell, and fourth memory cell are operation memory cells, one of the operation memory cells is chosen as a selected memory cell and remains of the operation memory cells are chosen as a plurality of unselected memory cells, wherein when operating on the selected memory cell, performing following voltage applications as required:

providing a work power voltage $V_{dd}$;

applying a substrate voltage $V_{sub}$ to the N-type well region or the N-type substrate connecting to the selected memory cell, respectively applying a bit voltage $V_{b1}$ and a word common-source voltage $V_{ws1}$ to the bit line and the word common-source line, which are connected to the selected memory cell, and respectively applying a bit voltage $V_{b2}$ and a word common-source voltage $V_{ws2}$ to the bit line and the word common-source line, which are connected to each of the plurality of unselected memory cells;

wherein in a write activity, the voltages satisfy following conditions:

$V_{sub}$ is equal to a high voltage (HV), $V_{b1}$ is equal to a medium voltage (MV) or the HV, $V_{ws1}$ is equal to 0 volt or the MV, $V_{b2}$ is electrically floating, and $V_{ws2}$ is equal to the HV;

wherein in an erase activity, the voltages satisfy following conditions:

$V_{sub}$ is equal to the HV, $V_{b1}=0$ volt, $V_{ws1}$ is equal to the HV, $V_{b2}$ is electrically floating, and $V_{ws2}$ is equal to the MV;

wherein in a read activity, the voltages satisfy following conditions:

$V_{sub}=V_{dd}$, $V_{b1}>V_{ws1}=0$ volt, and $V_{ws2}=V_{dd}$;

wherein each of the first memory cell, the second memory cell, the third memory cell, and the fourth memory cell comprises a field-effect transistor (FET) with a drain, a source, and a gate;

wherein the FETs of the first memory cell, the second memory cell, the third memory cell, and the fourth memory cell share a dielectric layer;

wherein the dielectric layer partially overlaps the sources and the gates of the FETs; and wherein the source and the gate of each FET of the sub-memory array are each connected to the first word common-source line.

* * * * *